(12) United States Patent
Yu et al.

(10) Patent No.: US 8,769,356 B2
(45) Date of Patent: Jul. 1, 2014

(54) BAD PAGE MANAGEMENT IN MEMORY DEVICE OR SYSTEM

(75) Inventors: Hak-Soo Yu, Seongnam-Si (KR); Chul-Woo Park, Yongin-Si (KR); Uk-Song Kang, Seongnam-Si (KR); Joo-Sun Choi, Yongin-Si (KR); Hong-Sun Hwang, Suwon-Si (KR); Jong-Pil Son, Seongnam-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 113 days.

(21) Appl. No.: 13/570,568

(22) Filed: Aug. 9, 2012

(65) Prior Publication Data

US 2013/0055048 A1    Feb. 28, 2013

(30) Foreign Application Priority Data

Aug. 22, 2011    (KR) .................. 10-2011-0083577

(51) Int. Cl.
*G11C 29/00*    (2006.01)
*G11C 29/24*    (2006.01)

(52) U.S. Cl.
CPC ............ *G11C 29/24* (2013.01); *G11C 29/00* (2013.01)
USPC .......... 714/719; 714/773; 714/2; 714/711; 714/723; 711/206; 711/209; 711/200

(58) Field of Classification Search
CPC ....................... G11C 29/00; G11C 29/24
USPC ............................................. 714/710
See application file for complete search history.

(56) References Cited

U.S. PATENT DOCUMENTS

| | | | | |
|---|---|---|---|---|
| 5,701,270 A * | 12/1997 | Mohan Rao | ............. | 365/230.03 |
| 5,835,430 A * | 11/1998 | Henning et al. | ............. | 365/201 |
| 6,144,577 A * | 11/2000 | Hidaka | ............. | 365/63 |
| 6,400,619 B1 * | 6/2002 | Hsu et al. | ............. | 365/200 |
| 7,434,122 B2 * | 10/2008 | Jo | ............. | 714/723 |
| 7,549,012 B2 * | 6/2009 | Cernea | ............. | 711/103 |
| 7,571,362 B2 * | 8/2009 | Pellicone et al. | ............. | 714/723 |
| 7,633,800 B2 * | 12/2009 | Adusumilli et al. | ..... | 365/185.09 |
| 2006/0018159 A1 * | 1/2006 | Picca et al. | ............. | 365/185.17 |
| 2009/0282301 A1 * | 11/2009 | Flynn et al. | ............. | 714/710 |
| 2012/0069691 A1 * | 3/2012 | Nasu et al. | ............. | 365/200 |
| 2012/0084611 A1 * | 4/2012 | Flynn et al. | ............. | 714/723 |
| 2012/0297258 A1 * | 11/2012 | Flynn et al. | ............. | 714/710 |

FOREIGN PATENT DOCUMENTS

| | | |
|---|---|---|
| JP | 2001-143494 | 5/2001 |
| JP | 2002-123431 | 4/2002 |
| KR | 1020100134816 A | 12/2010 |

* cited by examiner

*Primary Examiner* — John Trimmings
(74) *Attorney, Agent, or Firm* — Volentine & Whitt, PLLC

(57) ABSTRACT

A memory device comprises a memory cell array and a bad page map. The memory cell array comprises a plurality of memory cells arranged in pages and columns, wherein the memory cell array is divided into a first memory block and a second memory block each corresponding to an array of the memory cells. The bad page map stores bad page location information indicating whether each of the pages of the first memory block is good or bad. A fail page address of the first memory block is replaced by a pass page address of the second memory block according to the bad page location information.

18 Claims, 15 Drawing Sheets

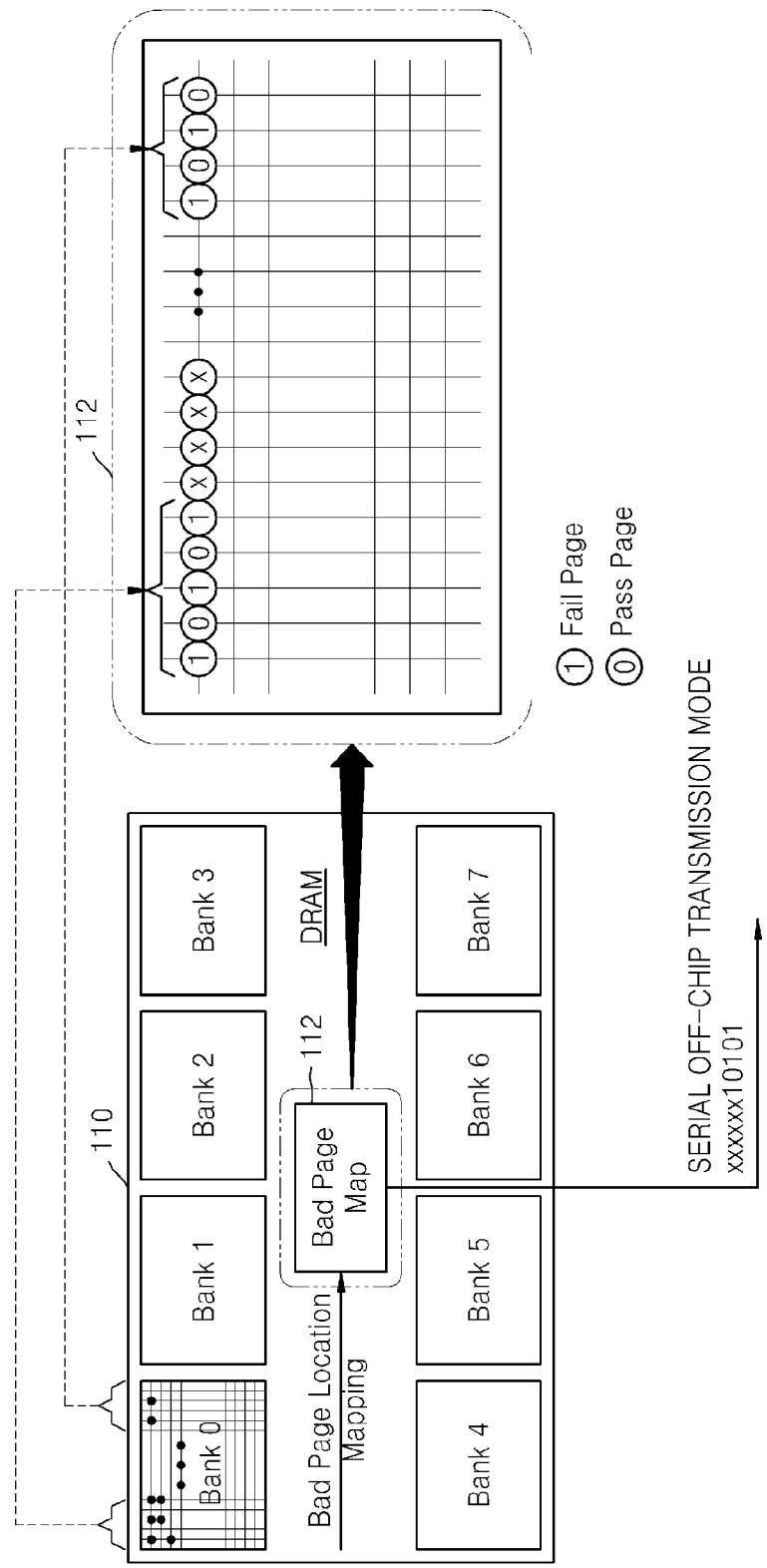

US 8,769,356 B2

BAD PAGE MANAGEMENT IN MEMORY DEVICE OR SYSTEM

CROSS-REFERENCE TO RELATED APPLICATIONS

This application claims priority under 35 U.S.C. §119 to Korean Patent Application No. 10-2011-0083577 filed on Aug. 22, 2011, the disclosure of which is hereby incorporated by reference in its entirety.

BACKGROUND OF THE INVENTION

The inventive concept relates generally to memory devices. More particularly, the inventive concept relates to memory devices and memory systems that manage bad pages.

Memory devices are widely used in electronic systems. For example, they play a significant role in most computers, mobile devices, industrial machinery, and communication equipment, to name but a few.

Many electronic systems require high-density memory devices. Accordingly, researchers are continually seeking ways to produce memory devices with higher density. Due to limits of semiconductor micro-manufacturing processes, there is a general tradeoff between increased memory density and reliability. In other words, as memory density increases, reliability tends to decrease accordingly. This reduction in reliability often leads to bad cells, which can reduce semiconductor yield.

In an effort preserve semiconductor yield in the presence of bad cells, researchers have developed various techniques for managing bad cells. Many of these techniques have focused on using redundant memory cells to replace bad cells.

SUMMARY OF THE INVENTION

In one embodiment of the inventive concept, a memory device comprises a memory cell array and a bad page map. The memory cell array comprises a plurality of memory cells arranged in pages and columns, wherein the memory cell array is divided into a first memory block and a second memory block each corresponding to an array of the memory cells. The bad page map stores bad page location information indicating whether each of the pages of the first memory block is good or bad. A fail page address of the first memory block is replaced by a pass page address of the second memory block according to the bad page location information.

In another embodiment of the inventive concept, a memory system comprises a memory device and a memory controller. The memory device comprises a first memory block, a second memory block, and a bad page map that stores bad page location information of the first memory block. The memory controller stores fail page addresses of the first memory block and pass page addresses of the second memory block that respectively replace the fail page addresses, according to bit information transmitted by the bad page map.

In yet another embodiment of the inventive concept, a method of operating a memory device comprising a memory cell array and a bad page map comprises storing, in the bad page map, bad page location information indicating whether each page in a first memory block of the memory cell array is good or bad, and replacing a fail page address of the first memory block with a pass page address in a second memory block of the memory cell according to the bad page location information.

These and other embodiments of the inventive concept can potentially improve semiconductor yield in the presence of bad memory cells.

BRIEF DESCRIPTION OF THE DRAWINGS

The drawings illustrate selected embodiments of the inventive concept. In the drawings, like reference numbers indicate like features.

FIG. 14 illustrates a bad page map in a memory device of FIG. 13 according to an embodiment of the inventive concept.

DETAILED DESCRIPTION

Embodiments of the inventive concept are described below with reference to the accompanying drawings. These embodiments are presented as teaching examples and should not be construed to limit the scope of the inventive concept.

The terminology used herein is for the purpose of describing particular embodiments only and is not intended to limit the inventive concept. As used herein, the singular forms "a", "an" and "the" are intended to include the plural forms as well, unless the context clearly indicates otherwise. The terms "comprises" and/or "comprising," or "includes" and/or "including" when used in this specification, indicate the presence of stated features, but do not preclude the presence of other features.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or the present disclosure, and will not be interpreted in an idealized or overly formal sense unless expressly so defined herein. For ease of explanation, certain embodiments are described below in the context of DRAM devices. However, the inventive concept is not restricted to DRAM devices.

The memory density of a memory device such as a DRAM is generally scaled in increments of $2^n$, where n represents the length of an address used for memory access. For example, a DRAM may be scaled to 1 Gb, 2 Gb, 4 Gb, or 8 Gb. To maintain full density of a DRAM, the DRAM may include redundancy cells that can be used to replace bad cells, which are memory cells having hardware or software defects that prevent proper operation. Cells having hardware defects may be memory cells with permanent defects, and cells having software defects may be memory cells having temporary defects that can be addressed through software adjustments. As the memory density of a DRAM is increased, the proportion of bad cells may increase, making it increasingly difficult to achieve full density (i.e., usable cells across the full address range), even when using redundancy cells.

Figure 1:
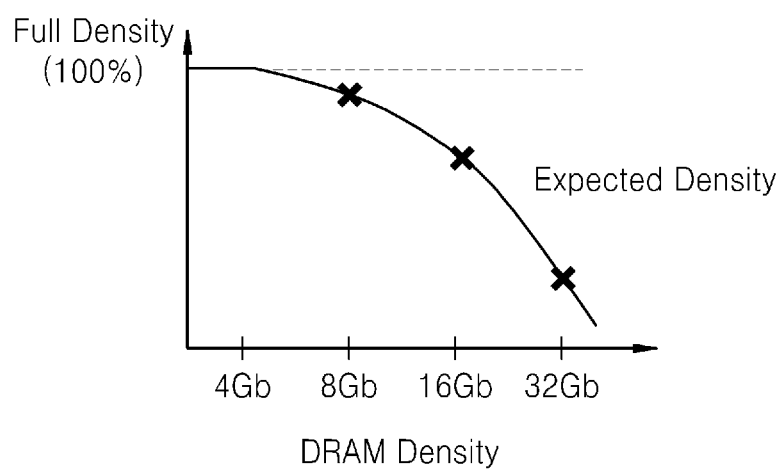
FIG. 1 is a graph showing an expected density of a dynamic random access memory (DRAM) as a function of DRAM scaling.

FIG. 1 is a graph showing an expected density of a DRAM as a function of DRAM scaling.

Referring to FIG. 1, as the memory density of the DRAM increases, the percentage of a full density of DRAM decreases due to an increase in bad cells. To secure a full density of a DRAM, the number of redundancy cells for repairing bad cells must be increased.

Figure 2A:
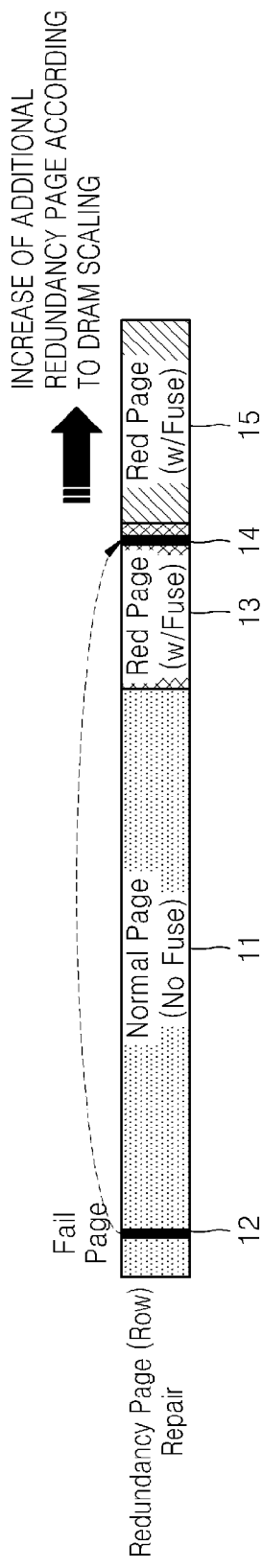
FIGS. 2A through 2C illustrate increases of memory density due to DRAM scaling with redundancy repair.
Figure 2B:
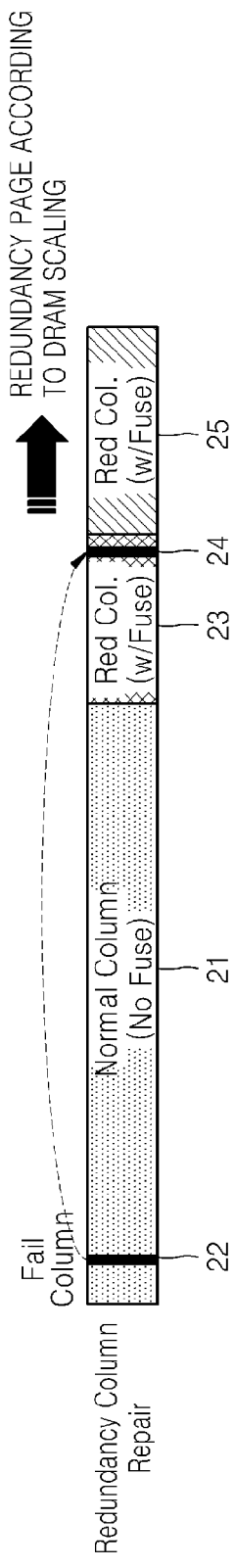
Figure 2C:
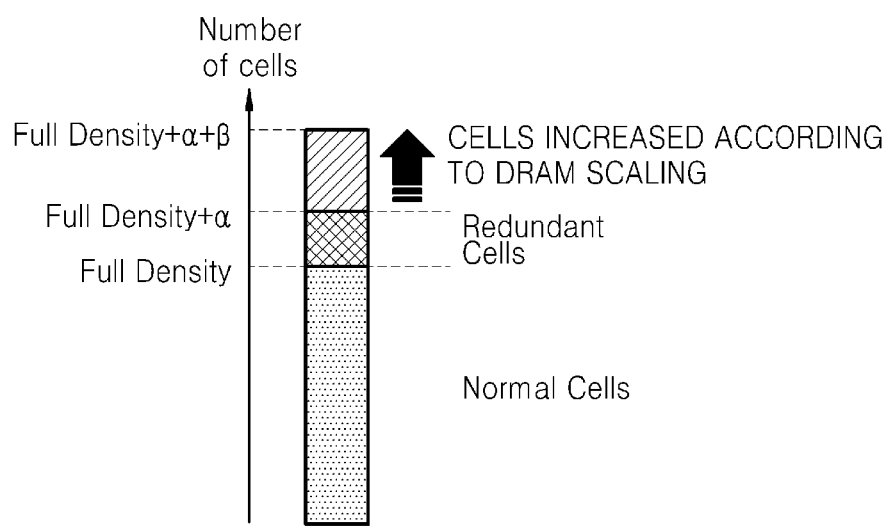

FIGS. 2A through 2C illustrate increases of memory density due to DRAM scaling with redundancy repair.

Figure 3:
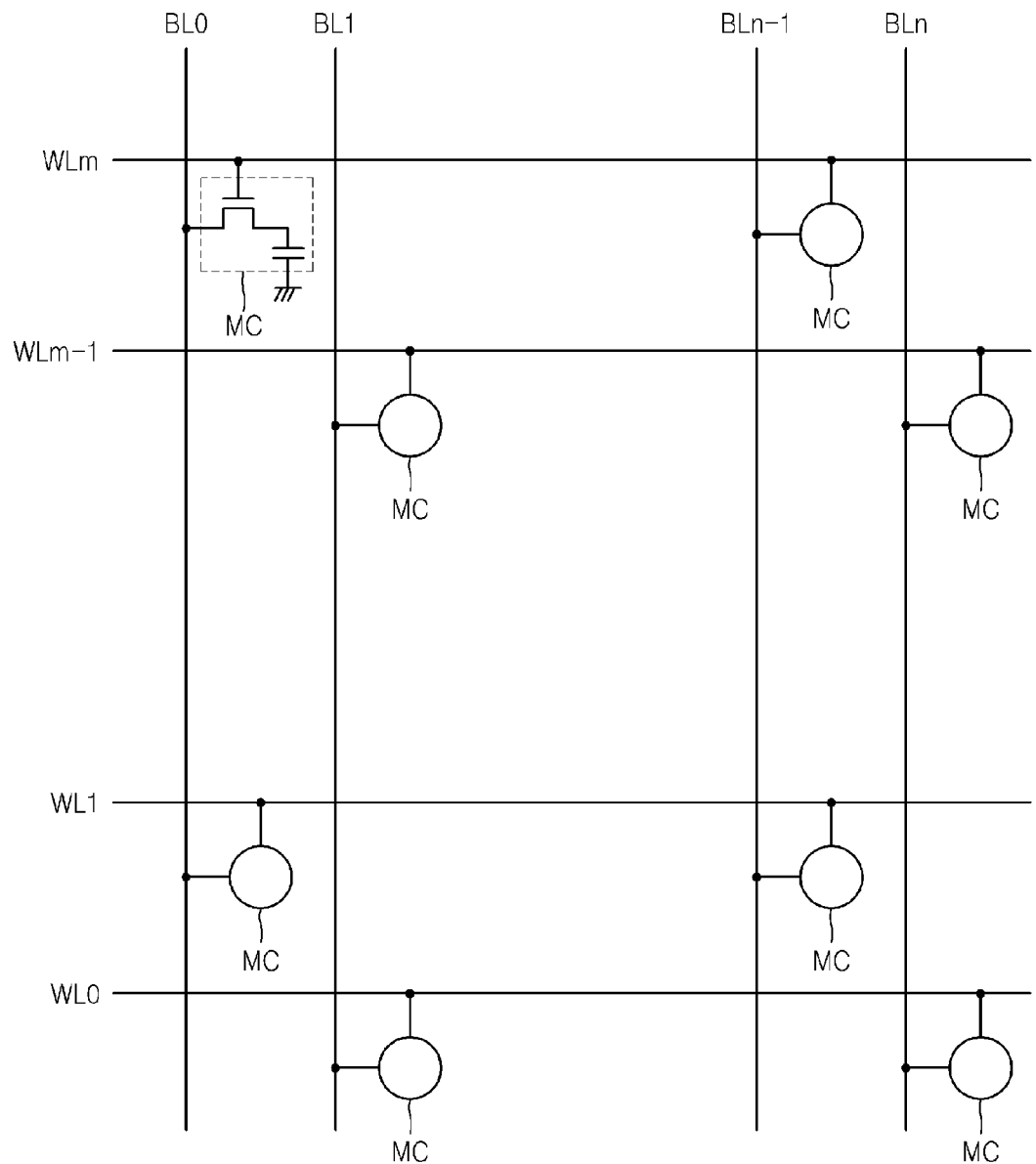
FIG. 3 is a circuit diagram of a memory cell array shown in FIG. 2A according to an embodiment of the inventive concept.

Referring to FIG. 2A, a normal memory cell array 11 comprises a fail row 12 (or fail page). A fail row is a row or page of memory cells comprising at least one bad cell or fail cell. Fail row 12 is replaced with a redundancy row 14. An example of normal memory cell array 11, as shown in FIG. 3, comprises a plurality of word lines WLs, a plurality of bit lines BLs, and a plurality of memory cells MCs arranged near intersections of word lines WLs and bit lines BLs. Each memory cell MC has a DRAM cell structure.

Word lines WLs to which memory cells MCs are connected may be defined as rows of normal memory cell array 11, and bit lines BLs to which memory cells MCs are connected may be defined as columns of normal memory cell array 11. In normal memory cell array 11, DRAM memory cells MCs are arranged in rows and columns. The rows of normal memory cell array 11 are referred to as normal pages, and fail rows among the normal pages are referred to as fail pages.

In a first redundancy memory cell array 13, DRAM memory cells MCs may be arranged in rows and columns as shown in FIG. 3. The memory cells of first redundancy memory cell array 13 are referred to as redundancy memory cells, the rows of first redundancy memory cell array 13 are referred to as redundancy rows, and the columns of first redundancy memory cell array 13 are referred to as redundancy columns. Redundancy row 14, which is included in first redundancy memory cell array 13, is referred to as a redundancy page.

There are no fuses in the normal pages of normal memory cell array 11, but there are fuses in the redundancy pages of first redundancy memory cell array 13. A fuse in redundancy page 14 can be programmed to be addressed in place of fail page 12 of normal memory cell array 11.

Based on DRAM scaling, the number of normal pages in normal memory cell array 11 may increase, and fail pages having hardware or software defects may be generated in the increased number of normal pages. The number of redundancy pages in first redundancy memory cell array 13 may be increased to repair the fail pages.

Fail redundancy pages having hardware or software defects may also be generated in the increased number of redundancy pages of first redundancy memory cell array 13. To repair the fail redundancy pages, a second redundancy memory cell array 15 including additional redundancy pages may be further included. In second redundancy memory cell array 15, DRAM memory cells MCs may be arranged in rows and columns as shown in FIG. 3.

Referring to FIG. 2B, a normal memory cell array 21 comprises a fail column 22 having a fail cell. Fail column 22 is replaced with a redundancy column 24. There are no fuses in the normal columns of normal memory cell array 21, but there are fuses in the redundancy columns of a first redundancy memory cell array 23. A fuse of redundancy column 24 is programmed to be addressed instead of fail column 22 of normal memory cell array 21.

Based on DRAM scaling, the number of normal columns in normal memory cell array 21 may increase. The number of redundancy columns in first redundancy memory cell array 23 may be increased to repair fail columns generated from among the increased number of normal columns. Fail redundancy columns may be generated in the increased number of redundancy columns of the first redundancy memory cell array 23. Accordingly, to repair the fail redundancy columns, a second redundancy memory cell array 25 including additional redundancy columns may be further included.

Referring to FIG. 2C in connection with FIGS. 2A and 2B, a full density obtained according to DRAM scaling includes normal cells connected to the normal pages or the normal columns in normal memory cell array 11 or 21. Due to redundant cells connected to the redundancy pages or redundancy columns of first redundancy memory cell array 13 or 23, the memory density of a DRAM may be increased from the full density by an amount α of the redundant cells. In addition, when the second redundancy memory cell array 15 or 25 is further included according to DRAM scaling, the memory density of the DRAM is further increased from a sum of the full density and the redundant cells by an amount β of the additional redundant cells.

It is generally difficult to obtain a full density of the DRAM due to limits of a semiconductor micro-manufacturing process. For example, where the full density of the DRAM is further increased due to addition of the additional redundant cells, a semiconductor yield may be further decreased due to generation of fail cells or fail redundant cells.

As indicated by the foregoing, memory density may be increased significantly through DRAM scaling. This scaling, however, may lead to an increase in the number of fail cells. Nevertheless, a memory density required by a system may be smaller than the full density of a memory device, so it may not be necessary to use the full density. Where unused memory cells in a DRAM can be used to repair fail cells, additional redundant cells do not need to be included. Accordingly, it may be useful to have a bad cell management method capable of satisfying a semiconductor target yield without needing to secure a full density of a DRAM.

Figure 4A:
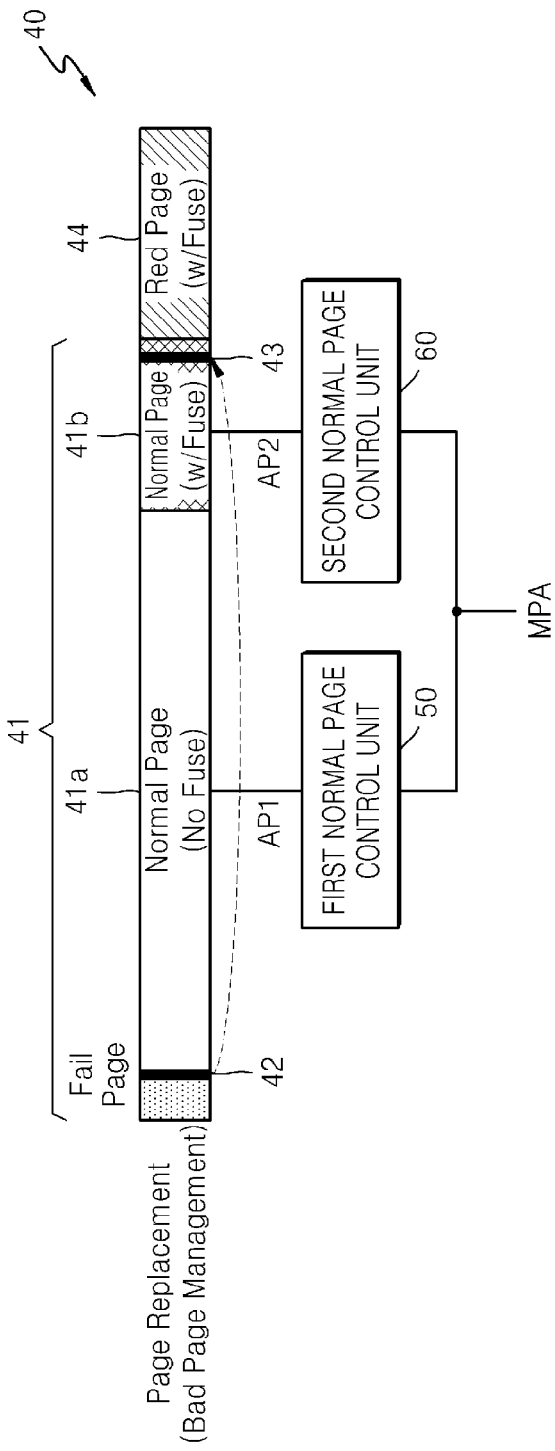
FIGS. 4A and 4B are block diagrams of a memory device that can be used to implement a bad page management method according to an embodiment of the inventive concept.
Figure 4B:
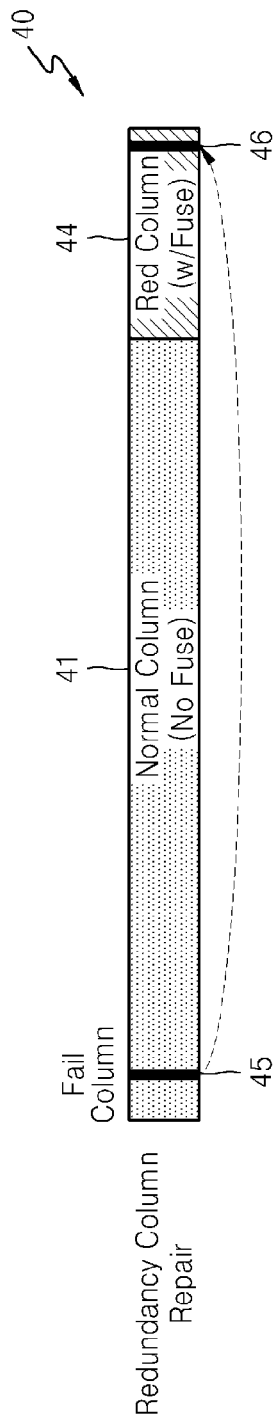

FIGS. 4A and 4B are block diagrams of a memory device 40 that can be used to implement a bad page management method according to an embodiment of the inventive concept. More specifically, FIG. 4A illustrates a fail page repairing method of memory device 40, and FIG. 4B illustrates a fail column repairing method of memory device 40. The fail page repairing method or the fail column repairing method may be selected according to the type of fail cells generated in a normal memory cell array 41 of memory device 40. For example, the fail page repairing method may be used where a multi-bit defect is generated in normal memory cell array 41. The fail column repairing method may be used where a single-bit defect is generated in normal memory cell array 41.

Referring to FIG. 4A, memory device 40 comprises normal memory cell array 41 and a redundancy memory cell array 44. Normal memory cell array 41 is divided into a first memory block 41a and a second memory block 41b.

In first memory block 41a, a plurality of first normal memory cells are arranged in columns and rows as shown in FIG. 3. Rows to which the first normal memory cells are connected are referred to as first normal pages. There are no fuses in the first normal pages.

In second memory block 41b, a plurality of second normal memory cells are arranged in columns and rows as shown in FIG. 3. Rows to which the second normal memory cells are connected are referred to as second normal pages. There are fuses in the second normal pages.

In memory device 40, where a first normal page 42 of first memory block 41a is a fail page, first normal page 42 may be replaced by a second normal page 43 of second memory block 41b. To this end, memory device 40 may further comprise a first normal page control unit 50 and a second normal page control unit 60.

The first normal page control unit 50 may be connected to first memory block 41a and control access to the fail first normal page 42 to be blocked. Where a memory access page address MPA received from an external source is consistent with the address of the fail first normal page 42 (hereinafter, referred to as a fail page 42), first normal page control unit 50 generates a first access page address AP1 that blocks access to fail page 42. Where memory access page address MPA is not consistent with the address of fail page 42, first normal page control unit 50 generates a first access page address AP1 that corresponds to memory access page address MPA of first memory block 41a.

Second normal page control unit 60 is connected to second memory block 41b and controls second normal page 43 instead of fail page 42 to be accessed. Where fail page 42 is generated in first memory block 41a and needs to be repaired, second normal page control unit 60 generates a second access page address AP2 using the address of second normal page 43 of second memory block 41b that replaces fail page 42. Where fail page 42 of first memory block 41a does not need to be repaired, second normal page control unit 60 generates a second access page address AP2 that corresponds to memory access page address MPA of second memory block 41b.

In redundancy memory cell array 44, a plurality of redundancy memory cells are arranged in rows and columns as shown in FIG. 3. Rows to which the redundancy memory cells are connected are referred to as redundancy pages. There are fuses in the redundancy pages. The redundancy pages may be used to repair first normal pages that are fail pages (or "fails", for short).

Redundancy memory cell array 44 typically comprises fewer redundancy pages than first redundancy memory cell array 13. Where fail pages among the first normal pages in normal memory cell array 41 can be replaced by the second normal pages, redundancy memory cell array 44 may be omitted from memory device 40.

FIG. 4B illustrates a redundancy repair method that replaces a fail column 45 in normal memory cell array 41 with a redundancy column 46 of redundancy memory cell array 44. There are fuses in the redundancy columns of redundancy memory cell array 44. A fuse of redundancy column 46 is programmed to be addressed instead of fail column 45 of normal memory cell array 41. The fuses in second memory block 41b and redundancy memory cell array 44 can be implemented using laser fuse circuits or anti-fuse circuits, for example.

Figure 5:
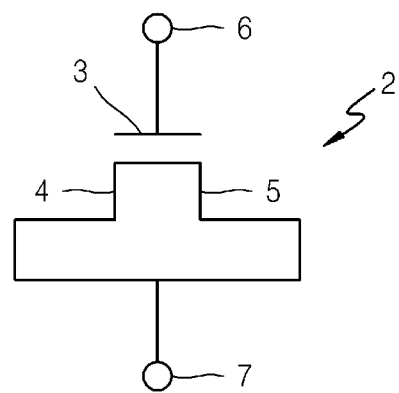
FIG. 5 is a circuit diagram of an anti-fuse circuit according to an embodiment of the inventive concept.

FIG. 5 is a circuit diagram of an anti-fuse circuit 2 according to an embodiment of the inventive concept.

Referring to FIG. 5, anti-fuse circuit 2 is a depletion-type MOS transistor having a source 4 and a drain 5. In a prime state, a resistance between a first node 6 connected to a gate 3 and a second node 7 connected to both source 4 and drain 5 is relatively large because a gate oxide layer is interposed between first and second nodes 6 and 7. Accordingly, no current flows between first node 6 and second node 7. Anti-fuse circuit 2 can be irreversibly changed from the no-current flowing state to a current-flowing state by destroying the gate oxide layer by applying a breakdown voltage between first node 6 and second node 7. Where the gate oxide layer is destroyed, resistance between first node 6 and second node 7 decreases.

Figure 6:
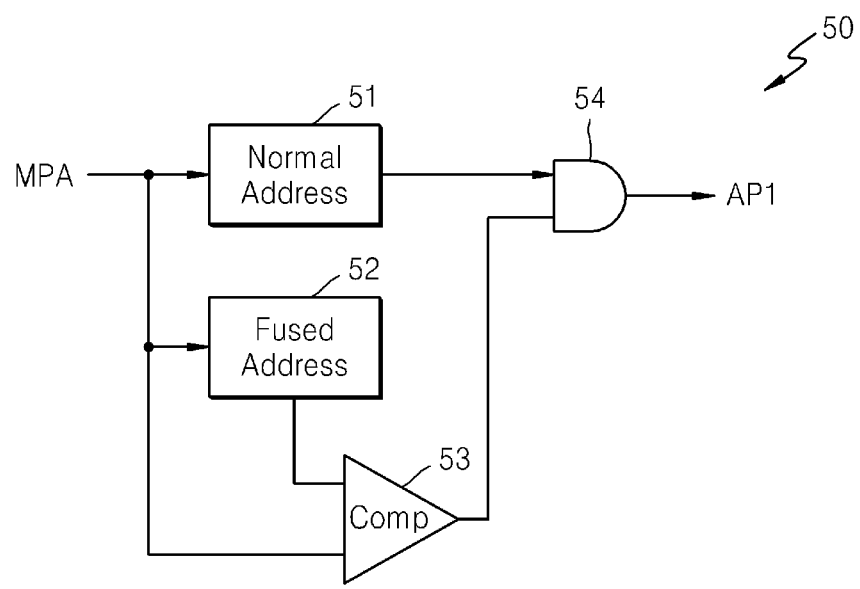
FIG. 6 is a block diagram of a first normal page control unit of the memory device of FIG. 4A according to an embodiment of the inventive concept.

FIG. 6 is a block diagram of first normal page control unit 50 of memory device 40 of FIG. 4A according to an embodiment of the inventive concept.

Referring to FIG. 6, first normal page control unit 50 determines whether memory access page address MPA accesses first normal pages of first memory block 41a. Memory access page address MPA is provided from a source external to memory device 40, such as a memory controller. First normal page control unit 50 comprises a first storage unit 51, a second storage unit 52, a comparator 53, and a logic circuit unit 54.

First storage unit 51 stores memory access page address MPA received from outside memory device 40. Second storage unit 52 also receives memory access page address MPA. Where memory access page address MPA is an address of fail page 42 generated in first memory block 41a, second storage unit 52 stores the address of fail page 42. Second storage unit 52 can be implemented using a laser fuse circuit or an anti-fuse circuit, for example. Second storage unit 52 programs the address of fail page 42 (hereinafter, a "fail page address") in anti-fuse circuit 2 of FIG. 5.

Comparator 53 compares memory access page address MPA of first storage unit 51 with the fail page address of second storage unit 52 and outputs a result of the comparison. For example, where memory access page address MPA of first storage unit 51 is the same as the fail page address of second storage unit 52, comparator 53 outputs a logic low level. On the other hand, where memory access page address MPA of first storage unit 51 is not the same as the fail page address of second storage unit 52, comparator 53 outputs a logic high level.

Logic circuit unit 54 receives memory access page address MPA of first storage unit 51 and the output of comparator 53 and outputs first access page address AP1. Logic circuit unit 54 can be implemented by an AND gate, for example. Where the output of comparator 53 is the logic low level, first access page address AP1 is output with the logic low level. Where the output of comparator 53 is the logic high level, first access page address AP1 is output with the same level as memory access page address MPA of first storage unit 51. Accordingly, where memory access page address MPA is the same as the fail page address, first normal page control unit 50 blocks access to fail page 42. Where memory access page address MPA is not the same as the fail page address, first normal page control unit 50 allows access of memory access page address MPA to first memory block 41*a* of FIG. 4A.

Figure 7:
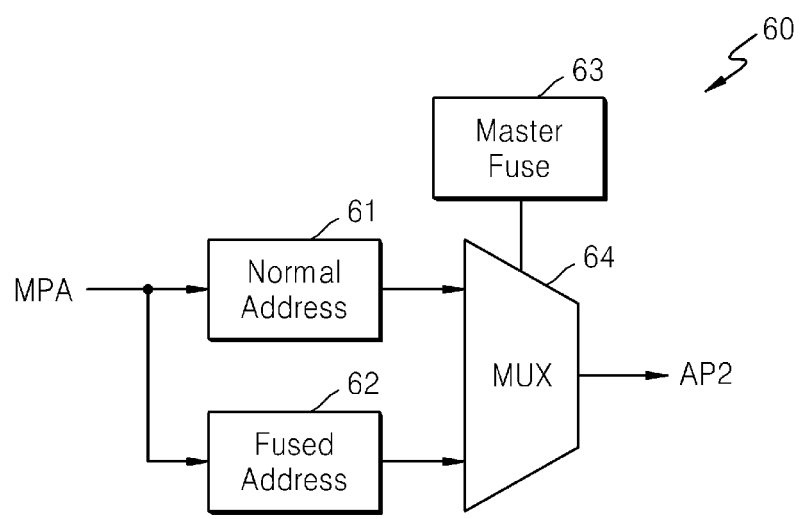
FIG. 7 is a block diagram of a second normal page control unit of the memory device of FIG. 4A according to an embodiment of the inventive concept.

FIG. 7 is a block diagram of second normal page control unit 60 of memory device 40 of FIG. 4A according to an embodiment of the inventive concept.

Referring to FIG. 7, second normal page control unit 60 determines whether memory access page address MPA accesses second normal pages of second memory block 41*b*. Second normal page control unit 60 comprises a first storage unit 61, a second storage unit 62, a selection control unit 63, and a selection unit 64.

First storage unit 61 receives and stores memory access page address MPA provided from outside memory device 40. Second storage unit 62 also receives memory access page address MPA. Where memory access page address MPA is an address of fail page 42 generated in first memory block 41*a*, second storage unit 62 stores an address of second normal page 43 that replaces the address of fail page 42. Second storage unit 62 can be implemented using a laser fuse circuit or an anti-fuse circuit, for example. In some embodiments, for instance, second storage unit 62 programs the address of second normal page 43 in anti-fuse circuit 2 of FIG. 5.

Selection control unit 63 stores a control signal that instructs replacement of fail page 42 of first memory block 41*a* with second normal page 43 of second memory block 42*a*. Selection control unit 63 can be implemented using a laser fuse circuit or an anti-fuse circuit. For instance, selection control unit 63 may program the fail page address in anti-fuse circuit 2 of FIG. 5.

Selection unit 64 selects memory access page address MPA of first storage unit 61 or the address of second normal page 43 to replace a fail page, in response to the control signal of selection control unit 63, and outputs a selected address as second access page address AP2. Where memory access page address MPA of first storage unit 61 is selected, second access page address AP2 is output like memory access page address MPA of second memory block 41*b*. Where the address of second normal page 43 that replaces a fail page of first memory block 41*a* is selected, second access page address AP2 is output like the address of second normal page 43.

Where fail page 42 is generated in first memory block 41*a* and needs to be repaired, second normal page control unit 60 allows access to second normal page 43 of second memory block 41*b* that replaces fail page 42. Where fail page 42 of first memory block 41*a* does not need to be repaired, second normal page control unit 60 allows access to memory access page address MPA of second memory block 41*b*.

Figure 8:
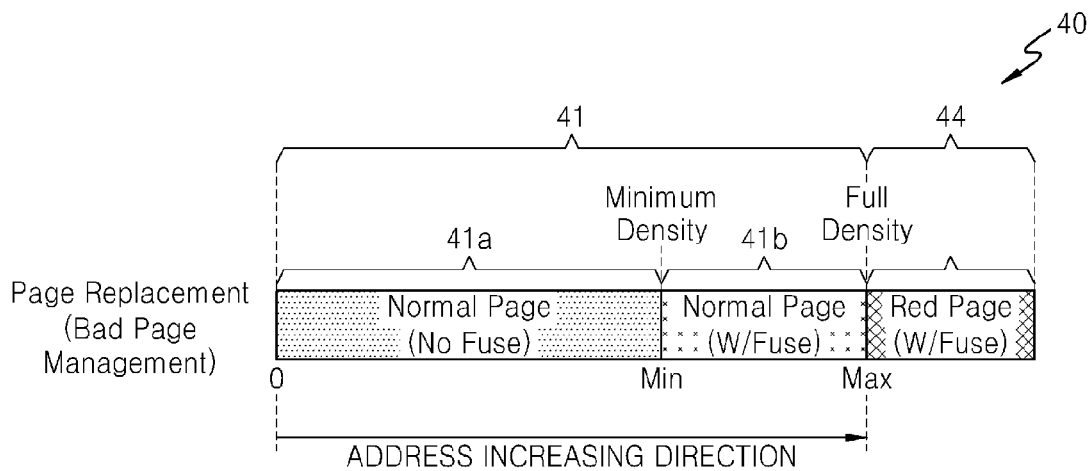
FIG. 8 is a diagram illustrating a continuous addressing scheme of normal memory cell arrays in the memory device of FIG. 4A according to an embodiment of the inventive concept.

FIG. 8 is a diagram illustrating a continuous addressing scheme of normal memory cell array 41 of FIG. 4A according to an embodiment of the inventive concept.

Referring to FIG. 8, it is assumed that a page address of normal memory cell array 41 has been set using a continuous addressing method of continuously increasing a page address in a direction indicated by an arrow. A least significant page address of normal memory cell array 41 is set at the left edge of first memory block 41*a*, and a most significant page address of normal memory cell array 41 is set at the right edge of second memory block 41*b*. The entire page addresses of first and second memory blocks 41*a* and 41*b* are factors used to calculate the full density of memory device 40.

Where a fail page is generated in first memory block 41*a*, the fail page may be repaired by replacing it with a normal page of second memory block 41*b*. All of the normal pages of second memory block 41*b* may replace the fail pages of first memory block 41*a*. Under these circumstances, the entire page addresses of first memory block 41*a* is a factor that can be used to calculate a minimum density of memory device 40.

Figure 9:
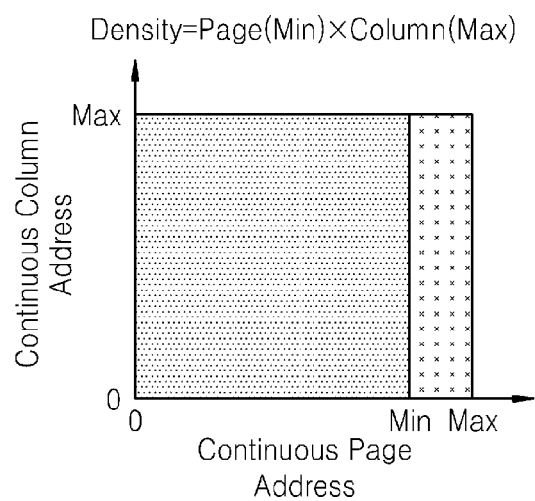
FIG. 9 is a graph showing memory density in relation to the continuous addressing scheme of FIG. 8.

FIG. 9 is a graph showing memory density in relation to the continuous addressing scheme of FIG. 8 according to an embodiment of the inventive concept.

Referring to FIG. 9, it is assumed that a maximum column of normal memory cell array 41 is fixed to a maximum column address. By continuous page addressing of first memory block 41*a* and second memory block 41*b*, a maximum row of first memory block 41*a* is a minimum page address of normal memory cell array 41 and a maximum row of second memory block 41*b* is a maximum page address of normal memory cell array 41.

The full density of memory device 40 is calculated by multiplying a maximum page address by a maximum column address. A minimum density of memory device 40 is calculated by multiplying a minimum page address by a maximum column address. Page addresses of second memory block 41*b*, which are excluded from the calculation of the minimum density of memory device 40, can be addressed to replace a fail page generated in first memory block 41*a*.

Figure 10:
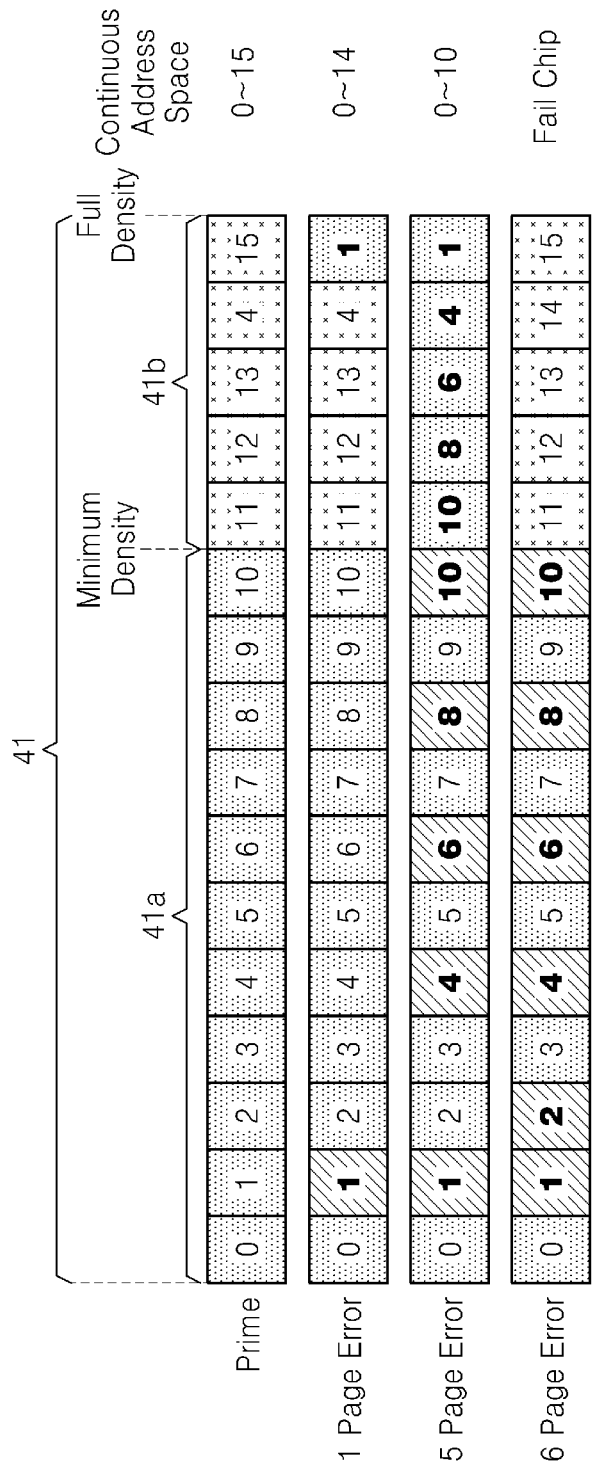
FIG. 10 illustrates a continuous addressing scheme used with a bad page management method according to an embodiment of the inventive concept.

FIG. 10 illustrates a continuous addressing scheme used with a bad page management method according to an embodiment of the inventive concept.

Referring to FIG. 10, in a method of managing fail pages of normal memory cell array 41, fail pages generated in first memory block 41*a* are replaced by normal pages of second memory block 41*b*. For convenience of explanation, it is assumed that in a prime state, first memory block 41*a* is addressed with pages numbered 0-10 and second memory block 41*b* is addressed with pages numbered 11-15. Accordingly, prime page addresses of normal memory cell array 41 are represented by the numbers 0-15.

It is assumed that where one fail page is generated in first memory block 41*a*, page No. 1 is a fail page. Page No. 1 of first memory block 41*a* is replaced by page No. 15 of second memory block 41*b*. Accordingly, page addresses of normal memory cell array 41 are represented by the numbers 0-14.

It is assumed that where 5 fail pages are generated in first memory block 41*a*, pages Nos. 1, 4, 6, 8, and 10 are fail pages. Page No. 1 of first memory block 41*a* is replaced by page No. 15 of second memory block 41*b*, page No. 4 of first memory block 41*a* is replaced by page No. 14 of second memory block 41*b*, page No. 6 of first memory block 41*a* is replaced by page No. 13 of second memory block 41*b*, page No. 8 of first memory block 41*a* is replaced by page No. 12 of second memory block 41*b*, and page No. 10 of first memory block 41*a* is replaced by page No. 11 of second memory block 41*b*. Accordingly, page addresses of normal memory cell array 41 are represented by the numbers 0-10.

In the embodiment of FIG. 10, fail pages generated in first memory block 41*a* are replaced by pages of second memory block 41*b* in a reverse order starting from the maximum page address of second memory block 41*b*. Accordingly, continuous page addressing of normal memory cell array 41 is possible.

It is assumed that the number of fail pages generated in first memory block 41*a* is greater than that of second memory block 41*b*. For example, it is assumed that pages Nos. 1, 2, 4, 6, 8, and 10 are fail pages. Six fail pages were generated in first memory block 41*a*, which is greater than the number of pages of second memory block 41*b*. Consequently, memory device 40 is processed as a fail chip.

Figure 11:
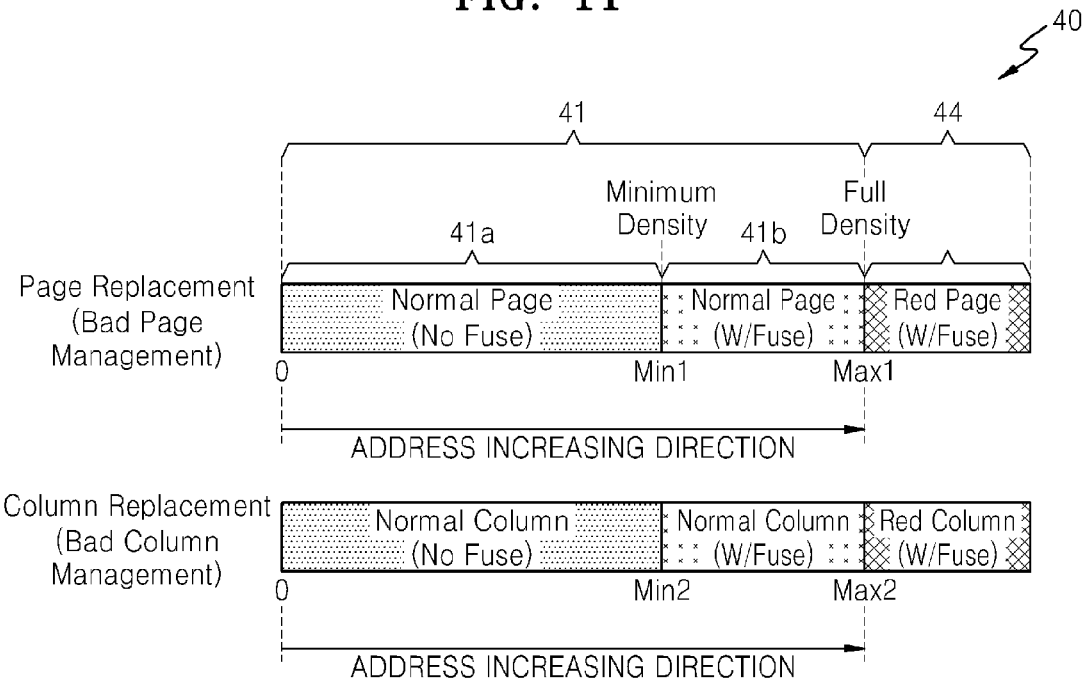
FIG. 11 illustrates a continuous addressing scheme of normal memory cell arrays of the memory device of FIG. 4A according to an embodiment of the inventive concept.

FIG. 11 illustrates a continuous addressing scheme of normal memory cell array 41 of FIG. 4A according to an embodiment of the inventive concept.

Referring to FIG. 11, where a fail page is generated in first memory block 41a of normal memory cell array 41, the fail page may be repaired by replacing it with a normal page of second memory block 41b. Where a fail column is generated in first memory block 41a, the fail column may be repaired by replacing it with a normal column of second memory block 41b. At this time, where a fail column is replaced by a normal column, a page size may be reduced.

It is assumed that the page addresses of normal memory cell array 41 are set using a continuous addressing method in which a page address is continuously increased in a direction indicated by an arrow and the column addresses of normal memory cell array 41 are set using a continuous addressing method of continuously increasing a column address in a direction indicated by an arrow. In the example of FIG. 11, the page address increasing direction is illustrated as being the same as the column address increasing direction. However, the page address increasing direction is a direction of rows in which word lines WLs of normal memory cell array 41 are arranged, and the column address increasing direction is a direction of columns in which bit lines BLs of normal memory cell array 41 are arranged. Accordingly, in an actual implementation, the page address increasing direction and the column address increasing direction typically intersect with each other perpendicularly.

A least significant page address 0 of normal memory cell array 41 is set at the left edge of first memory block 41a, and a most significant page address Max1 of memory cell array 41 is set at the right edge of second memory block 41b. The most significant page address Max1 of normal memory cell array 41 is the same as the maximum page address of second memory block 41b. Maximum page address Max1 of second memory block 41b is a factor used to calculate the full density of memory device 40.

Where a fail page is generated in first memory block 41a, the fail page may be repaired by replacing it with a normal page of second memory block 41b. All of the normal pages of second memory block 41b may replace the fail pages of first memory block 41a. In this case, a maximum page address Min1 of first memory block 41a is a factor for calculating the minimum density of memory device 40.

The least significant column address 0 of normal memory cell array 41 is set at the left edge of first memory block 41a, and the most significant column address Max2 of normal memory cell array 41 is set at the right edge of second memory block 41b. The most significant column address Max2 of normal memory cell array 41 is the same as the maximum column address of second memory block 41b. Maximum column address Max2 of second memory block 41b is a factor used to calculate the full density of memory device 40.

Where a fail column is generated in first memory block 41a, the fail column may be repaired by replacing it with a normal column of second memory block 41b. All of the normal columns of second memory block 41b may replace the fail columns of first memory block 41a. In this case, a maximum column address Min1 of first memory block 41a is another factor used to calculate the minimum density of memory device 40.

Figure 12:
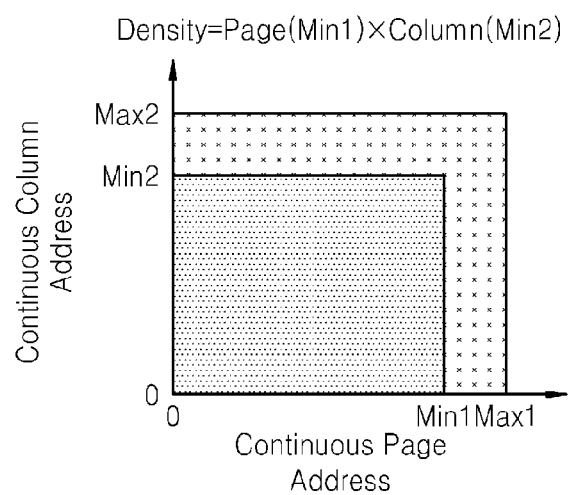
FIG. 12 is a graph showing memory density in relation to the continuous addressing scheme of FIG. 11.

FIG. 12 is a graph showing memory density in relation to the continuous addressing scheme of FIG. 11.

Referring to FIG. 12, by continuous page addressing and continuous column addressing of first memory block 41a and second memory block 41b, a maximum row Min1 of first memory block 41a is a minimum page address of normal memory cell array 41 and a maximum row Max1 of second memory block 41b is a maximum page address of normal memory cell array 41. A maximum column Min2 of first memory block 41a is a minimum column address of normal memory cell array 41, and a maximum column Max2 of second memory block 41b is a maximum column address of normal memory cell array 41.

The full density of memory device 40 is calculated by multiplying maximum page address MAX1 by maximum column address MAX2. The minimum density of memory device 40 is calculated by multiplying minimum page address MIN1 by minimum column address MIN2. Page addresses and column addresses of second memory block 41b, which are excluded from the calculation of the minimum density of memory device 40, is addressed to replace a fail page or fail column generated in first memory block 41a.

Figure 13:
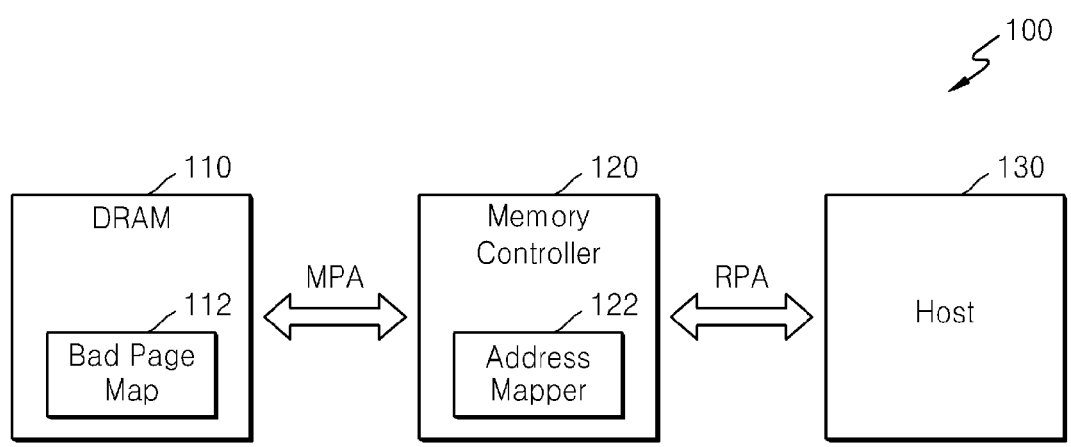
FIG. 13 is a block diagram of a memory system that can be used to implement a bad page management method according to an embodiment of the inventive concept.

FIG. 13 is a block diagram showing an example of a memory system 100 that can be used to implement a bad page management method according to an embodiment of the inventive concept.

Referring to FIG. 13, memory system 100 comprises a memory device 110, a memory controller 120, and a host 130. Memory device 110 comprises a plurality of banks and a bad page map 112 for storing bad pages generated in each of the banks. Memory controller 120 receives a requested page address RPA from host 130 and outputs a memory access page address MPA. Memory access page address MPA is provided from an address mapper 122 that implements a bad page management according to an embodiment of the inventive concept. Memory controller 120 controls memory device 110 according to memory access page address MPA. Host 130 can be implemented using a microprocessor or other suitable technology.

FIG. 14 illustrates bad page map 112 of memory device 110 according to an embodiment of the inventive concept.

Referring to FIG. 14, memory device 110 comprises a plurality of banks, namely, first to eighth banks BANK0-BANK7. Each of the first to eighth banks BANK0-BANK7 comprises instances of normal memory cell array 41 and redundancy memory cell array 44 of FIG. 4A or 4B. Location information of fail pages within first to eighth banks BANK0-BANK7 is stored in bad page map 112. For example, fail page location information of first bank BANK0 is illustrated. Whether each page of first bank BANK0 is good (or pass) or fail is represented by bit "1" or "0". The bit "1" represents a fail page, and the bit "0" represents a pass page.

Bad page map 112 typically comprises an array of devices having a non-volatile property. For example, bad page map 112 may be implemented using an anti-fuse circuit. Bad page map 112 may store bits "1" and "0" for the page addresses of first bank BANK0. For example, where a least significant page of first bank BANK0 is a fail page, a bit "1" is stored in an area on the anti-fuse circuit that corresponds to a least significant page address 00000000000000 of first bank BANK0. Where a first page next to the least significant page (i.e., a "next page" of the least significant page) is a pass page, a bit "0" is stored in an area on the anti-fuse circuit that corresponds to a page address 00000000000001. Where a second page next to the first page (i.e., a "next next page" or "2-next page" of the least significant page) is a fail page, a bit "1" is stored in an area on the anti-fuse circuit that corresponds to a page address 00000000000010. Where a third page next to the second page (i.e., a "3-next page" of the least significant page) is a pass page, a bit "0" is stored in an area on the anti-fuse circuit that corresponds to a page address 00000000000011. Where a fourth page next to the third page (i.e., a "4-next page" of the least significant page) is a fail page, a bit "1" is stored in an area on the anti-fuse circuit that corresponds to a page address 00000000000100.

The bits stored in bad page map 112 are sequentially transmitted to memory controller 120 of FIG. 13 in a serial off-chip transmission mode. The bits are sequentially transmitted in a 10101xxxxxxx order, starting from the bit corresponding to the least significant page address 00000000000000. Memory controller 120 of FIG. 13 decodes the bits stored in bad page map 112 to sort them into a fail page address and a pass page address.

Figure 15A:
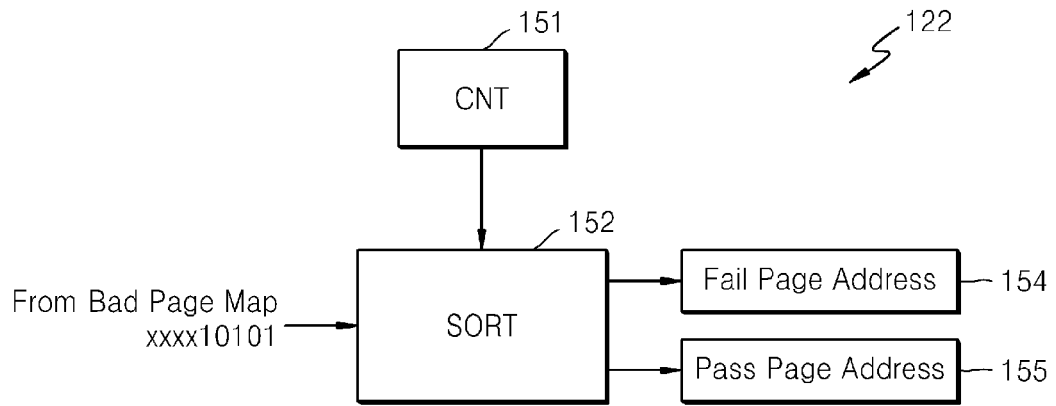
FIGS. 15A through 15C are block diagrams of an address mapper in a memory controller of FIG. 13 according to an embodiment of the inventive concept.
Figure 15B:
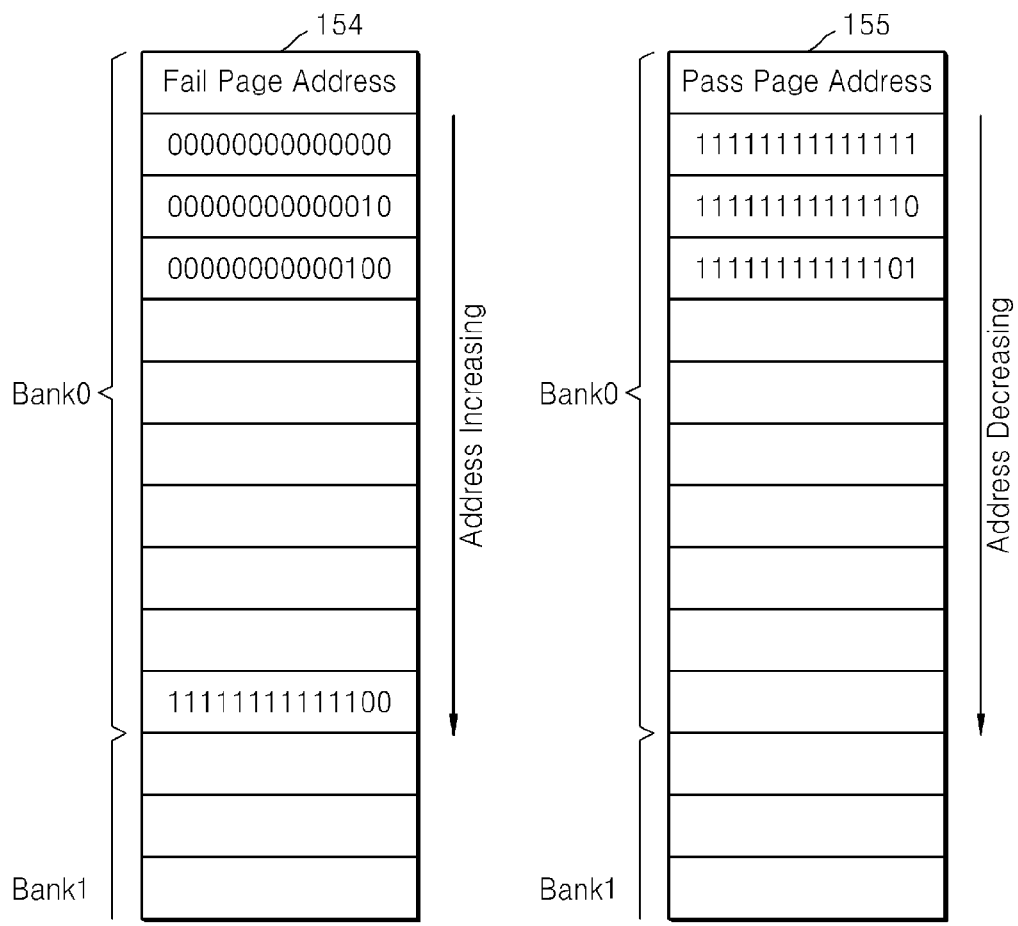
Figure 15C:
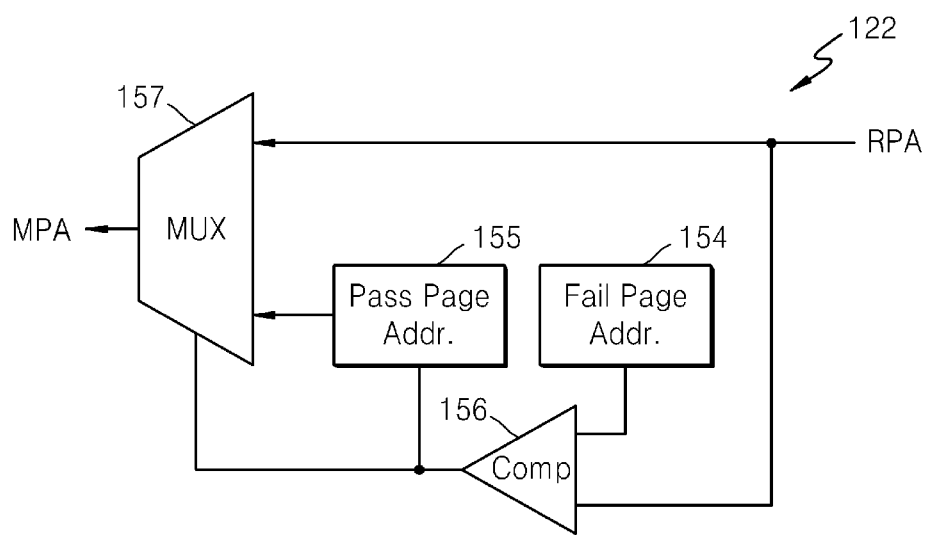

FIGS. 15A through 15C are block diagrams of address mapper 122 in memory controller 120 according to an embodiment of the inventive concept.

Referring to FIG. 15A, address mapper 122 comprises a counter 151 and a sorting unit 152. Counter 151 increases a page address by +1 at a time, starting from a start page address. For example, counter 151 may set the least significant page address 00000000000000 of the first bank BANK0 to be a start page address. Counter 151 outputs page addresses increased by +1 from the least significant page address 00000000000000 of first bank BANK0.

Sorting unit 152 sequentially receives the bits of bad page map 112 of memory device 110 of FIG. 13. Sorting unit 152 matches the bits transmitted from bad page map 112 in the 10101xxxxxxx order with the page addresses counted by counter 151.

Sorting unit 152 determines page addresses of counter 151 matched with the bits "0" of bad page map 112 to be fail page addresses. Sorting unit 152 determines page addresses of counter 151 matched with the bits "1" of bad page map 112 to be good page addresses. Second storage unit 52 may store the fail page addresses in a first storage unit 154 of FIG. 15B.

Sorting unit 152 matches the least significant page address 00000000000000 of first bank BANK0 output from counter 151 with a first bit "1" of bad page map 112. Sorting unit 152 determines the least significant page address 00000000000000 of first bank BANK0 to be a fail page address, according to the first bit "1" of bad page map 112. The fail least significant page address 00000000000000 of first bank BANK0 is stored in first storage unit 154 of FIG. 15B for storing fail page addresses.

Sorting unit 152 determines the next page address 00000000000001 of the least significant page address 00000000000000 to be a good page address, according to a second bit "0" of bad page map 112.

Sorting unit 152 determines a next page address 00000000000010 of the least significant page address to be a fail page address, according to a third bit "1" of bad page map 112, and stores the fail page address in first storage unit 154 of FIG. 15B.

Sorting unit 152 determines a next page address 00000000000011 of the least significant page address 00000000000000 to be a good page address, according to a fourth bit "0" of bad page map 112.

Sorting unit 152 determines a next page address 00000000000100 of the least significant page address to be a fail page address, according to a fifth bit "1" of bad page map 112, and stores the fail page address in first storage unit 154 of FIG. 15B.

Sorting unit 152 stores pass page addresses matched to respectively repair the fail page addresses of first bank BANK0, in second storage unit 155 of FIG. 15B. As described above with respect to the fail page management according to an embodiment of the inventive concept, sorting unit 152 may implement continuous page addressing to replace fail page addresses generated in first memory block 41a with page addresses of second memory block 41b in a reverse direction starting from a maximum page address 11111111111111 of second memory block 41b.

Sorting unit 152 replaces fail page address 00000000000000 stored in first storage unit 154 with the maximum page address 11111111111111. The fail page address 00000000000010 may be replaced by a page address 11111111111110, and the fail page address 00000000000100 may be replaced by a page address 11111111111101. Such continuous page addressing may be written in the form of a page address mapping table. The replacing page addresses 11111111111111, 11111111111110, and 11111111111101 may be stored as pass page addresses in second storage unit 155 of FIG. 15B.

Referring to FIG. 15B, the fail page addresses of first bank BANK0 and the pass page address replacing the fail page addresses are stored in a page address mapping table. Next, fail page addresses of the remaining banks BANK1-BANK8 and pass page address replacing the fail page addresses may be stored in the page address mapping table.

Referring to FIG. 15C, address mapper 122 further comprises first storage unit 154, a second storage unit 155, a comparator 156, and a selection unit 157. As shown in FIG. 15B, first storage unit 154 stores fail page addresses generated in memory device 100. As shown in FIG. 15B, second storage unit 155 may store pass page addresses that replace the fail page addresses generated in memory device 100. First storage unit 154 and second storage unit 155 can be implemented using page address mapping tables, for example.

Comparator 156 compares requested page address RPA received from host 130 with a fail page address in first storage unit 154 and outputs a result of the comparison. For example, where requested page address RPA is the same as the fail page address in first storage unit 154, comparator 156 outputs a logic high level. On the other hand, where requested page address RPA is different from the fail page address in first storage unit 154, comparator 156 outputs a logic low level.

Selection unit 157 outputs, as memory access page address MPA, either requested page address RPA received from host 130 or a pass page address stored in second storage unit 155 in response to an output of comparator 156. Selection unit 157 outputs, as memory access page address MPA, a pass page address stored in second storage unit 155 in response to a logic high level output of comparator 156, and outputs, as memory access page address MPA, requested page address RPA received from host 130 in response to a logic low level output of comparator 156.

Figure 16:
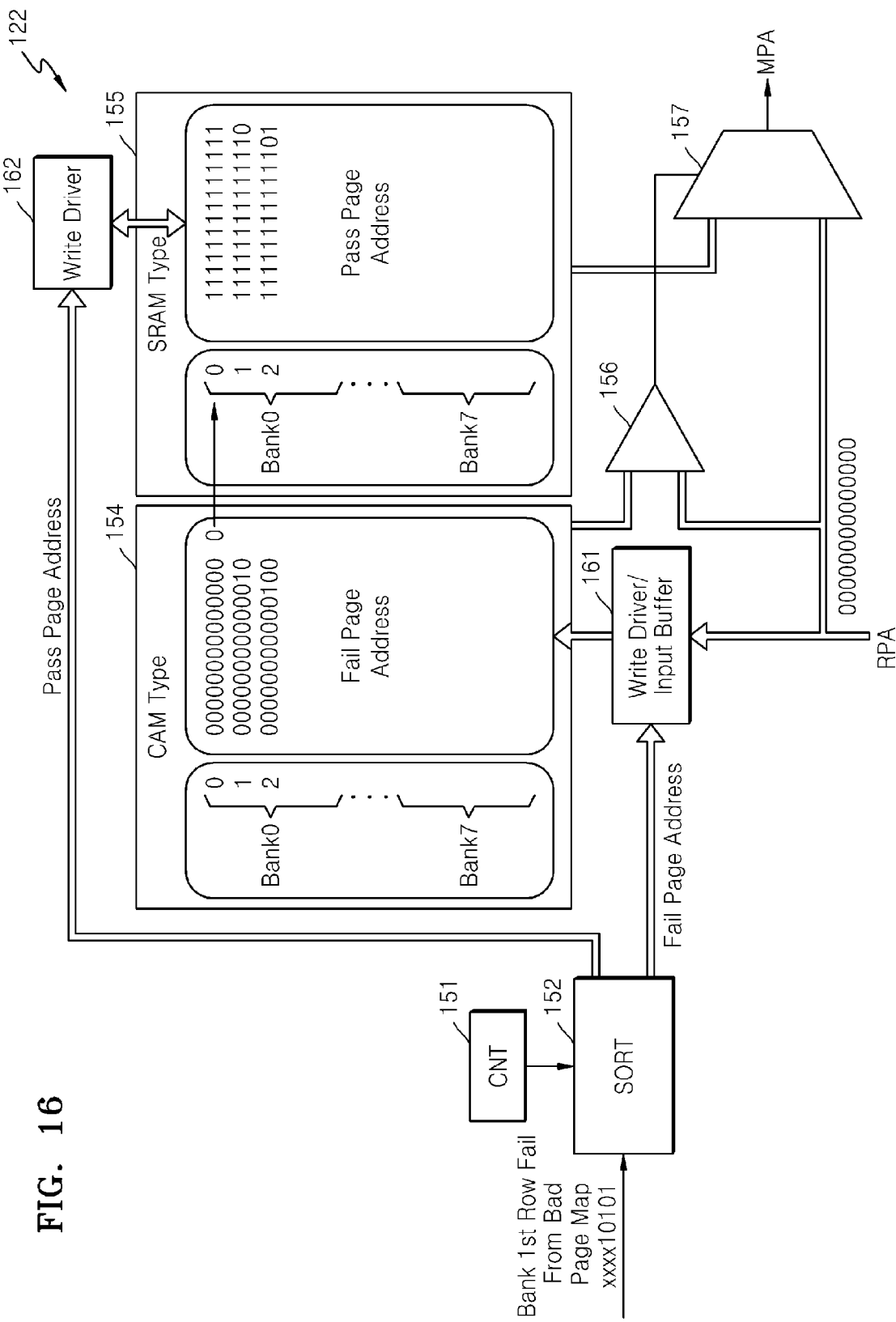
FIG. 16 is a block diagram of an entire structure of the address mapper illustrated in FIGS. 15A-15C according to an embodiment of the inventive concept.

FIG. 16 is a block diagram of an entire structure of address mapper 122 illustrated in FIGS. 15A-15C according to an embodiment of the inventive concept.

Referring to FIG. 16, address mapper 122 stores fail page addresses in first storage unit 154 according to bits transmitted from bad page map 112 in the 10101xxxxxxx order, and stores pass page addresses matched to replace the fail page addresses in second storage unit 155, using counter 151 and sorting unit 152. The fail page addresses is stored in first storage unit 154 via a first write driver 161, and the pass page addresses is stored in second storage unit 155 via a second write driver 162. First storage unit 154 is a Content Addressable Memory (CAM) type storage unit, and second storage unit 155 implements a page address mapping table composed of a static random-access memory (SRAM) type storage unit.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A memory device, comprising:
a memory cell array comprising a plurality of memory cells arranged in pages and columns, wherein the memory cell array is divided into a first memory block and a second memory block each corresponding to an array of the memory cells;
a bad page map that stores bad page location information indicating whether each of the pages of the first memory block is good or bad;
a first page control unit that generates a first access page address to block access to a fail page address of the first memory block; and
a second page control unit that generates a second access page address to allow access to a pass page address of the second memory block,
wherein the fail page address of the first memory block is replaced by the pass page address of the second memory block according to the bad page location information, and
wherein the second page control unit comprises:
a first storage unit that stores a memory access page address received from an external source;
a second storage unit that stores the pass page address of the second memory block that replaces the fail page address of the first memory block;
a selection control unit that stores a control signal for instructing the fail page address of the first memory block to be replaced by the pass page address of the second memory block; and
a selection unit that selects the memory access page address stored in the first storage unit or the pass page address of the second memory block stored in the second storage unit and outputs a result of the selection as the second access page address.

2. The memory device of claim 1, wherein the bad page map indicates the bad page location information using an anti-fuse circuit.

3. The memory device of claim 1, wherein fail page addresses of the first memory block are replaced by pass page addresses of the second memory block in a reverse direction starting from a maximum page address of the second memory block.

4. The memory device of claim 1, wherein the first page control unit comprises:
a third storage unit that stores a memory access page address received from an external source;
a fourth storage unit that stores the fail page address of the first memory block;
a comparator that compares the memory access page address of the third storage unit with the fail page address of the fourth storage unit; and
a logic circuit unit that receives the memory access page address of the third storage unit and an output of the comparator and outputs the first access page address.

5. The memory device of claim 1, wherein the memory device does not comprise a redundancy memory cell array that replaces bad cells generated in the memory cell array.

6. A memory system, comprising:
a memory device comprising a first memory block, a second memory block, and a bad page map that stores bad page location information of the first memory block;
a memory controller that stores fail page addresses of the first memory block and pass page addresses of the second memory block that respectively replace the fail page addresses, according to bit information transmitted by the bad page map;
a first page control unit that generates a first access page address to block an address to a fail page address of the first memory block; and
a second page control unit that generates a second access page address to allow access to a pass page address of the second memory block,
wherein the second page control unit comprises:
a first storage unit that stores a memory access page address received from an external source;
a second storage unit that stores the pass page address of the second memory block that replaces the fail page address of the first memory block;
a selection control unit that stores a control signal for instructing the fail page address of the first memory block to be replaced by the pass page address of the second memory block; and
a selection unit that selects the memory access page address stored in the first storage unit or the pass page address of the second memory block stored in the second storage unit and outputs a result of the selection as the second access page address.

7. The memory system of claim 6, wherein the memory device stores bad page location information indicating whether each of the pages of the first memory block is good or bad.

8. The memory system of claim 7, wherein the memory device stores the bad page location information in the form of a bit.

9. The memory system of claim 7, wherein the memory device sequentially transmits units of bit information indicating whether each of the pages of the first memory block is good or bad to the memory controller, starting from a least significant page address of the first memory block.

10. The memory system of claim 9, wherein the memory controller comprises:
a counter that generates a page address sequentially increased from the least significant page address of the first memory block; and
a sorting unit that stores the page address of the counter as the fail page address according to the bit information of the bad page map.

11. The memory system of claim 6, wherein the memory controller stores the pass page addresses of the second memory block in a reverse direction starting from a maximum page address of the second memory block.

12. The memory system of claim 6, wherein the memory controller comprises the second page control unit, the first storage unit stores the fail page addresses, and the second storage unit stores the pass page addresses, and
wherein the memory controller compares a requested page address received from a host with the fail page addresses and outputs the requested page address or the pass page address as an access page address of the memory device according to a comparison result.

13. The memory system of claim 12, wherein the first storage unit is a content addressable memory (CAM) type storage unit.

14. The memory system of claim 12, wherein the second storage unit is a static random-access memory (SRAM) type storage unit.

15. A method of operating a memory device comprising a memory cell array and a bad page map, comprising:

storing, in the bad page map, bad page location information indicating whether each page in a first memory block of the memory cell array is good or bad; and replacing a fail page address of the first memory block with a pass page address in a second memory block of the memory cell array according to the bad page location information;

wherein replacing the fail page address comprises generating a first access page address to block an address to the fail page address of the first memory block, and generating a second access page address to allow access to the pass page address of the second memory block, and wherein generating the second access page address comprises storing a memory access page address received from an external source, storing the pass page address of the second memory block that replaces the fail page address of the first memory block, storing a control signal for instructing the fail page address of the first memory block to be replaced by the pass page address of the second memory block, selecting the memory access page address stored in the first storage unit or the pass page address of the second memory block stored in the second storage unit and outputting a result of the selection as the second access page address.

16. The method of claim 15, wherein the bad page location information comprises a bit.

17. The method of claim 15, wherein storing the bad page location information comprises changing a state of an anti-fuse circuit.

18. The method of claim 15, further comprising replacing fail page addresses of the first memory block by pass page addresses of the second memory block in a reverse direction starting from a maximum page address of the second memory block.

* * * * *